(12) United States Patent  (10) Patent No.: US 8,389,307 B2
Liu  (45) Date of Patent: Mar. 5, 2013

(54) LIGHT EMITTING DIODE PACKAGE AND FABRICATION METHOD THEREOF

(75) Inventor: Yu-Huan Liu, Taipei County (TW)

(73) Assignee: Everlight Electronics Co., Ltd. (TW)

( * ) Notice: Subject to any disclaimer, the term of this patent is extended or adjusted under 35 U.S.C. 154(b) by 392 days.

(21) Appl. No.: 12/606,013

(22) Filed: Oct. 26, 2009

(65) Prior Publication Data
US 2010/0193816 A1 Aug. 5, 2010

(30) Foreign Application Priority Data

Feb. 4, 2009 (TW) ................................ 98103449 A

(51) Int. Cl.
*H01L 21/00* (2006.01)
(52) U.S. Cl. ................ 438/27; 438/25; 438/26; 438/28; 438/29; 257/98; 257/99; 257/100
(58) Field of Classification Search .............. 438/25–29, 438/110, 116; 257/98–100
See application file for complete search history.

(56) References Cited

U.S. PATENT DOCUMENTS

| 6,294,410 | B1 | 9/2001 | Jiang et al. | |
|---|---|---|---|---|
| 6,841,422 | B2 * | 1/2005 | Jiang et al. | 438/125 |
| 7,161,190 | B2 * | 1/2007 | Chikugawa | 257/99 |
| 8,035,125 | B2 * | 10/2011 | Abe | 257/99 |
| 2008/0083973 | A1 * | 4/2008 | Yamada et al. | 257/676 |
| 2008/0087996 | A1 | 4/2008 | Miyaki et al. | |
| 2009/0014745 | A1 * | 1/2009 | Wang et al. | 257/98 |
| 2009/0267104 | A1 * | 10/2009 | Hsu et al. | 257/99 |
| 2010/0163918 | A1 * | 7/2010 | Kim et al. | 257/99 |

FOREIGN PATENT DOCUMENTS

| CN | 2413390 Y | 1/2001 |
|---|---|---|
| CN | 1588652 A | 3/2005 |
| CN | 101159302 | 4/2008 |
| JP | 4-277670 A | 10/1992 |
| JP | 7106501 | 4/1995 |
| TW | 200824158 | 6/2008 |
| TW | M343242 | 10/2008 |

* cited by examiner

*Primary Examiner* — Bac Au
(74) *Attorney, Agent, or Firm* — Andy M. Han; Han IP Law PLLC

(57) ABSTRACT

A light emitting diode package and a fabrication method thereof are provided. The light emitting diode package comprises a lead frame, having a frame body and a conductive layer covering the frame body. A reflector has a first portion and a second portion sandwiching the lead frame, wherein the first portion has a depression to expose the lead frame, and a light emitting diode chip is disposed on the lead frame in the depression. The fabrication method comprises forming a frame body and forming a conductive layer covering the frame body to form a lead frame. A first portion and a second portion of a reflector are formed to sandwich the lead frame, wherein the first portion has a depression to expose the lead frame. A light emitting diode chip is disposed on the lead frame in the depression.

20 Claims, 1 Drawing Sheet

LIGHT EMITTING DIODE PACKAGE AND FABRICATION METHOD THEREOF

CROSS REFERENCE TO RELATED APPLICATIONS

This application claims the benefit of Taiwan Application No. 98103449, filed on Feb. 4, 2009, the entirety of which is incorporated by reference herein.

BACKGROUND OF THE INVENTION

1. Field of the Invention

The present invention relates to an electronic device package, and in particular relates to a light emitting diode package.

2. Description of the Related Art

Light emitting diodes are one kind of semiconductor device, which have a P-type and an N-type semiconductor layer. When a forward voltage is applied to the light emitting diode, electrons flow from electrodes and holes come from electrodes toward an interface between the P-type and the N-type semiconductor layers to combine and produce energy. Then, the energy is released in a light form. Light emitting diodes have several advantages over other conventional light sources such as high brightness, small sizes, lighter weights, lower power consumption and longer operating lifespan, such that they are widely applied to various light sources and display devices.

FIG. 1 shows a cross section of a conventional light emitting diode package. A plastic material 10 formed by injection molding is used to sandwich a metal lead frame 12 to form a carrier for a light emitting diode 14. The light emitting diode 14 is disposed on the lead frame 12 and a conductive wire 16 is used to electrically connect the light emitting diode 14 and the lead frame 12. Then, a depression of the plastic material 10 of the carrier is filled with an encapsulant 18 to cover the light emitting diode 14, to form the conventional light emitting diode package.

However, in the conventional light emitting diode package, the difference between a thermal expansion coefficient of the plastic material 10 of the carrier and a thermal expansion coefficient of the metal lead frame 12 is large. In general, the thermal expansion coefficient of the plastic material 10 is usually about 100 ppm/° C., but the thermal expansion coefficient of the lead frame 12 is usually about 20 ppm/° C. Accordingly, adhesion between the plastic material 10 of the carrier and the lead frame 12 is poor. Thus as the conventional light emitting diode package is exposed to heat and cold, a gap is produced between the plastic material 10 of the carrier and the lead frame 12, such that water vapor may easily permeate through the gap and decrease reliability of the light emitting diode.

Additionally, for the conventional light emitting diode package, a shape of the lead frame 12 is formed from bending by a mechanical process. Accordingly, a gap is easily produced between the plastic material 10 of the carrier and the lead frame 12 to further decrease reliability of the light emitting diode.

Therefore, a light emitting diode package and a fabrication method which can overcome the above mentioned problems of the conventional light emitting diode packages is therefore desired.

BRIEF SUMMARY OF THE INVENTION

According to an illustrative embodiment, a light emitting diode package is provided. The light emitting diode package comprises: a lead frame having a frame body and a conductive layer covering the frame body; a reflector having a first portion and a second portion sandwiching the lead frame, wherein the first portion has a depression to expose the lead frame; and a light emitting diode chip disposed on the lead frame in the depression.

According to another illustrative embodiment, a method for fabricating a light emitting diode package is provided. The method comprises: forming a frame body and forming a conductive layer covering the frame body to form a lead frame; forming a first portion and a second portion of a reflector to sandwich the lead frame, wherein the first portion has a depression to expose the lead frame, and the lead frame extends to a side and a portion of a lower surface of the second portion of the reflector; and disposing a light emitting diode chip on the lead frame in the depression.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
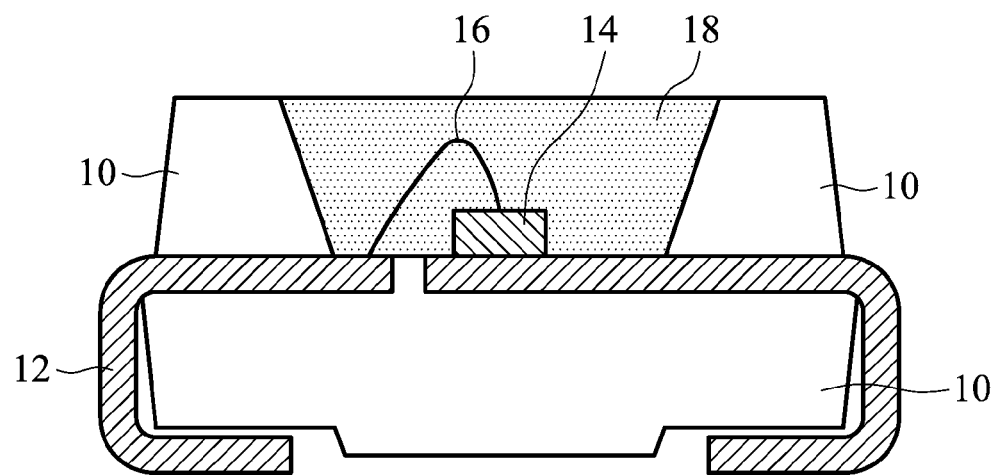
FIG. 1 shows a illustrative cross section of a conventional light emitting diode package.
Figure 2:
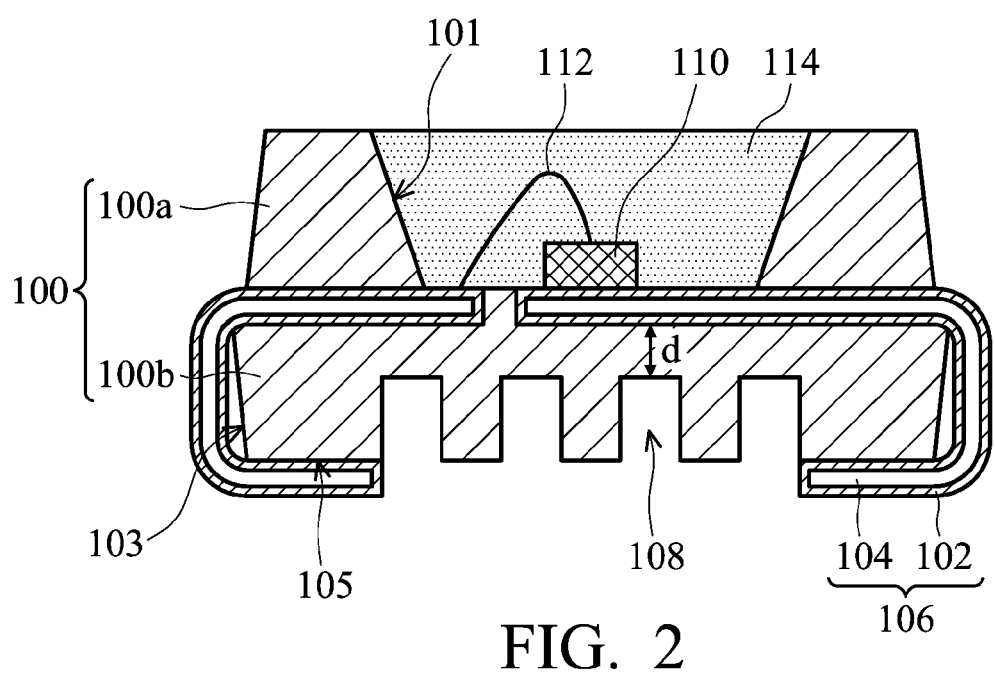
FIG. 2 shows a illustrative cross section of a light emitting diode package according to an embodiment of the invention.

Referring to FIG. 2, a cross section of a light emitting diode package according to an embodiment of the invention is shown. First, a frame body 104 of a lead frame 106 is provided. The materials of the frame body 104 may be a thermoplastic plastic material, for example polyphthalamide (PPA), liquid crystal polymer (LCP) or other suitable materials. The frame body 104 can be formed by an injection molding or a compression molding step.

Then, a conductive layer 102 is formed on a surface of the frame body 104. The materials of the conductive layer 102 may be indium tin oxide (ITO), metal or other conductive materials. The metal material is material such as aluminum, gold or silver. The thickness of the conductive layer 102 may be about 5 μm. The conductive layer 102 can be formed on the frame body 104 by a physical vapor deposition (PVD), a chemical vapor deposition (CVD), a coating process, or an electroplating process step, thus completing fabrication of the lead frame 106.

Next, the thermoplastic plastic material is processed by a stamping press molding or an injection molding step to form a first portion 100a and a second portion 100b of a reflector 100 for sandwiching the lead frame 106. The lead frame 106 is extended to a side 103 and a portion of a lower surface 105 of the second portion 100b of the reflector 100. The materials of the reflector 100 may be polyphthalamide (PPA), liquid crystal polymer (LCP) or other suitable materials.

The first portion 100a of the reflector 100 has a depression 101 to expose the lead frame 106. The shape of the depression 101 can be any shape. In an embodiment of the invention, the lower surface 105 of the second portion 100b of the reflector 100 can further have a plurality of depressions 108 thereon. The shape of the depressions 108 can be any shapes, and the numbers and the arrangements of the depressions 108 are not limited. The depression 101 of the first portion 100a and the depressions 108 of the second portion 100b of the reflector 100 can be formed together with the step of forming the reflector 100 by the stamping press molding step. No additional steps are needed to form the depression 101 and the depressions 108.

In an embodiment of the invention, one characteristic of the light emitting diode package is that a thermal expansion coefficient of the reflector 100 is similar to a thermal expansion coefficient of the frame body 104 of the lead frame 106. The difference between the thermal expansion coefficients of the reflector 100 and the frame body 104 of the lead frame 106 is less than 40 ppm/° C., and can be between about 20 and 40 ppm/° C. In an embodiment of the invention, the thermal expansion coefficients of the reflector 100 may be about 100 ppm/° C. and the thermal expansion coefficients of the frame body 104 of the lead frame 106 may be about 60 to 120 ppm/° C. In the light emitting diode packages of the invention, the thermal expansion coefficients of the reflector 100 and the frame body 104 of the lead frame 106 are the same, such that if the light emitting diode packages are exposed to heat and cold, no gap will be produced between the reflector 100 and the lead frame 106. Therefore, the light emitting diode packages of the invention prevent water vapor from easily permeating through a gap between the reflector 100 and the lead frame 106, increasing reliability of light emitting diodes.

Moreover, in an embodiment of the light emitting diode package of the invention, the lower surface 105 of the second portion 100b of the reflector 100 has the plurality of depressions 108 thereon, such that a heat dissipation area of the reflector 100 is increased. Meanwhile, a distance d between a bottom of the depression 108 and the lead frame 106 is small, such that heat dissipation capability of the light emitting diode package is enhanced and stability of the light emitting diode package is enhanced. In an embodiment of the invention, the distance d may be about 0.2 mm.

In an embodiment of the fabrication method of the light emitting diode package of the invention, the lead frame 106 is formed first, and then the first portion 100a and the second portion 100b of the reflector 100 are formed to sandwich the lead frame 106. Therefore, the second portion 100b of the reflector 100 can be tightly fit into the lead frame 106, minimizing the gap between the reflector 100 and the lead frame 106 to prevent water vapor from permeating through the gap and enhancing reliability of the light emitting diode package.

Next, a light emitting diode chip 110 is disposed on the lead frame 106 in the depression 101 of the reflector 100. A contact (not shown) of the light emitting diode chip 110 is directly contacted with the lead frame 106 and a lead 112 is utilized for electrically connecting another contact (not shown) of the light emitting diode chip 110 to the lead frame 106. Then, an encapsulant 114 is utilized to fill the depression 101 of the reflector 100, covering the light emitting diode chip 110 and the lead 112, completing fabrication of an embodiment of the light emitting diode package of the invention.

As the above mentions, the light emitting diode packages of the invention and the fabrication methods thereof can enhance the seal between the reflector and the lead frame. Moreover, the invention can prevent a gap from being produced between the reflector and the lead frame to reduce water vapor permeation into the light emitting diode packages, thus enhancing the reliability of the light emitting diode. Meanwhile, the design of the plurality of depressions on the bottom of reflector also can enhance heat dissipation capability of the light emitting diode packages, and further improve the stability of the light emitting diode packages.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a light emitting diode package, comprising:
    forming a frame body;
    forming a conductive layer covering the frame body to form a lead frame;
    forming a reflector, wherein the reflector has a first portion and a second portion sandwiching the lead frame, wherein a first surface of the first portion has a first depression that exposes at least a portion of the lead frame, wherein a second surface of the first portion opposite to the first surface of the first portion is in contact with the lead frame, wherein a first surface of the second portion is in contact with the lead frame, wherein a second surface of the second portion opposite to the first surface of the second portion includes at least one second depression thereon, wherein a depth of the at least one second depression is more than half of, but not completely through, a distance between the first and the second surfaces of the second portion to provide an increased surface area for heat dissipation; and
    disposing a light emitting diode chip on the lead frame in the first depression.

2. The method as claimed in claim 1, wherein the step of forming the frame body of the lead frame comprises an injection molding or a compression molding step.

3. The method as claimed in claim 1, wherein the step of forming the conductive layer of the lead frame comprises a physical vapor deposition (PVD), a chemical vapor deposition (CVD), a coating process, or an electroplating process step.

4. The method as claimed in claim 1, wherein the step of forming the reflector comprises a stamping press molding or an injection molding step.

5. The method as claimed in claim 1, further comprising forming a lead electrically connecting a contact of the light emitting diode chip with the lead frame.

6. The method as claimed in claim 1, further comprising providing an encapsulant filling the depression of the reflector to cover the light emitting diode chip.

7. The method as claimed in claim 1, wherein the lower surface of the second portion of the reflector has a plurality of depressions thereon.

8. The method as claimed in claim 1, wherein a material of the conductive layer of the lead frame comprises indium tin oxide (ITO) or metal.

9. The method as claimed in claim 1, wherein a material of the frame body of the lead frame comprises polyphthalamide or liquid crystal polymer.

10. The method as claimed in claim 1, wherein a material of the reflector comprises polyphthalamide or liquid crystal polymer.

11. A method for fabricating a light emitting diode package, comprising:
    forming a frame body;

forming a conductive layer covering the frame body to form a lead frame;

forming a reflector, wherein the reflector has a first portion and a second portion sandwiching the lead frame, wherein a first surface of the first portion has a first depression that exposes at least a portion of the lead frame, wherein a second surface of the first portion opposite to the first surface of the first portion is in contact with the lead frame, wherein a first surface of the second portion is in contact with the lead frame, wherein a second surface of the second portion opposite to the first surface of the second portion includes at least one second depression thereon, wherein a depth of the at least one second depression is more than half of, but not completely through, a distance between the first and the second surfaces of the second portion to provide an increased surface area for heat dissipation, and wherein a difference between a thermal expansion coefficient of the reflector and a thermal expansion coefficient of the frame body of the lead frame is less than 40 ppm/° C.; and disposing a light emitting diode chip on the lead frame in the first depression.

12. The method as claimed in claim 11, wherein the step of forming the frame body of the lead frame comprises an injection molding or a compression molding step.

13. The method as claimed in claim 11, wherein the step of forming the conductive layer of the lead frame comprises a physical vapor deposition (PVD), a chemical vapor deposition (CVD), a coating process, or an electroplating process step.

14. The method as claimed in claim 11, wherein the step of forming the reflector comprises a stamping press molding or an injection molding step.

15. The method as claimed in claim 11, further comprising forming a lead electrically connecting a contact of the light emitting diode chip with the lead frame.

16. The method as claimed in claim 11, further comprising providing an encapsulant filling the depression of the reflector to cover the light emitting diode chip.

17. The method as claimed in claim 11, wherein the lower surface of the second portion of the reflector has a plurality of depressions thereon.

18. The method as claimed in claim 11, wherein a material of the conductive layer of the lead frame comprises indium tin oxide (ITO) or metal.

19. The method as claimed in claim 11, wherein a material of the frame body of the lead frame comprises polyphthalamide or liquid crystal polymer.

20. The method as claimed in claim 11, wherein a material of the reflector comprises polyphthalamide or liquid crystal polymer.

* * * * *